United States Patent
Tsukahara

(10) Patent No.: US 8,653,880 B2
(45) Date of Patent: Feb. 18, 2014

(54) SWITCH CIRCUIT HAVING IMPROVED RF POWER CHARACTERISTICS

(75) Inventor: Yoshihiro Tsukahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/608,449

(22) Filed: Sep. 10, 2012

(65) Prior Publication Data

US 2013/0169346 A1 Jul. 4, 2013

(30) Foreign Application Priority Data

Dec. 28, 2011 (JP) ................................ 2011-287750

(51) Int. Cl.
*H03K 17/687* (2006.01)

(52) U.S. Cl.
USPC ............ 327/427; 327/436; 327/437; 333/103

(58) Field of Classification Search
USPC ................... 327/427, 434, 436–437; 333/103
See application file for complete search history.

(56) References Cited

U.S. PATENT DOCUMENTS

| | | | |
|---|---|---|---|
| 5,731,607 A | 3/1998 | Kohama | |
| 6,066,993 A | 5/2000 | Yamamoto et al. | |
| 7,263,337 B2 * | 8/2007 | Struble | 455/78 |
| 7,345,521 B2 * | 3/2008 | Takahashi et al. | 327/308 |
| 2009/0184747 A1 | 7/2009 | Honda | |

FOREIGN PATENT DOCUMENTS

| | | |
|---|---|---|
| JP | 7-303001 A | 11/1995 |
| JP | 8-195667 A | 7/1996 |
| JP | 11-145811 A | 5/1999 |
| JP | 11-205188 A | 7/1999 |
| JP | 2007-184981 A | 7/2007 |
| JP | 2009-201096 A | 9/2009 |

OTHER PUBLICATIONS

German Patent Office, Office Action in German Patent Application No. 10 2012 218 962.9 (Jul. 11, 2013) English Translation.

* cited by examiner

*Primary Examiner* — Kenneth B. Wells
(74) *Attorney, Agent, or Firm* — Leydig, Voit & Mayer, Ltd.

(57) ABSTRACT

A switch circuit includes: first, second, and third input-output terminals; a first switching element connected between the first and second input-output terminals; a second switching element connected between the third input-output terminal and a grounding point; a third switching element connected between the first and third input-output terminals; a fourth switching element connected between the second input-output terminal and the grounding point; a first control voltage applying terminal connected to control terminals of the first and second switching elements; a second control voltage applying terminal connected to control terminals of the third and fourth switching elements; first and second resistors connected between the control terminals of the first and second switching elements and the first control voltage applying terminal, respectively; and first and second diodes connected in parallel with the first and second resistors, respectively, and having cathodes connected to the first control voltage applying terminal.

2 Claims, 7 Drawing Sheets

SWITCH CIRCUIT HAVING IMPROVED RF POWER CHARACTERISTICS

BACKGROUND OF THE INVENTION

1. Field of the Invention

The present invention relates to a switch circuit mainly used in high-frequency band wireless communications equipment, high-frequency band radar equipment, and the like.

2. Background Art

A switch circuit is used in the system for transmitting signals in a high-frequency band, such as a micro-wave band or a millimeter band. FIGS. 17, 18, and 19 are diagrams of systems using switch circuits.

In the system shown in FIG. 17, a switch SW is used for switching the transmitting and the receiving of signals. In the system shown in FIG. 18, a switch SW is used for switching signals from two antennas ANT. In the system shown in FIG. 19, a switch SW is used for preventing signals to be reflected from an antenna ANT and inputted into the receiver J1 when high-power signals are transmitted from the transmitter S1 in the system using a circulator CIR. Thereby, the receiver J1 containing a low noise amplifier can be protected. In these systems, a switch circuit using switching elements in series-parallel is used (for example, refer to FIG. 11 in Japanese Patent No. 4538016).

SUMMARY OF THE INVENTION

If the power durability of the switch SW is low, the following problem occurs. In FIG. 17, if a high power is inputted in the terminal P3 of the switch SW from the transmitter S1, transmitted signals are inputted in the receiver J1 via the terminals P1 and P2 in the OFF side of the switch SW. For this reason, the transmitting power is lowered, and the protecting function of the receiver J1 by the switch SW is lowered. Similarly, in the system shown in FIG. 18, the accuracy of signal switching by the switch SW is lowered, and the protection function by the receiver J1 is lowered; and in the system shown in FIG. 19, the protecting function of the receiver J1 is lowered. Furthermore, in each system, the function itself of the switch SW may be lowered.

A switch having an improved power durability by connecting switching elements in multiple stages and controlling the potentials between the elements has also been proposed (for example, refer to Japanese Patent No. 4538016). However, there were problems wherein the scale of the circuit is enlarged, and the circuit configuration is complicated.

In view of the above-described problems, an object of the present invention is to provide a switch circuit which can improve the power durability in the OFF side by a simple circuit configuration.

According to the present invention, a switch circuit includes: first, second, and third input-output terminals; a first switching element connected between the first input-output terminal and the second input-output terminal; a second switching element connected between the third input-output terminal and a grounding point; a third switching element connected between the first input-output terminal and the third input-output terminal; a fourth switching element connected between the second input-output terminal and the grounding point; a first control voltage applying terminal connected to control terminals of the first and second switching elements; a second control voltage applying terminal connected to control terminals of the third and fourth switching elements; first and second resistors connected between the control terminals of the first and second switching elements and the first control voltage applying terminal respectively; and first and second diodes connected in parallel with the first and second resistors respectively and having cathodes connected to the first control voltage applying terminal.

The present invention makes it possible to improve the power durability in the OFF side by a simple circuit configuration.

Other and further objects, features and advantages of the invention will appear more fully from the following description.

DETAILED DESCRIPTION OF THE PREFERRED EMBODIMENTS

A switch circuit according to the embodiments of the present invention will be described with reference to the drawings. The same components will be denoted by the same symbols, and the repeated description thereof may be omitted.

First Embodiment

Figure 1:
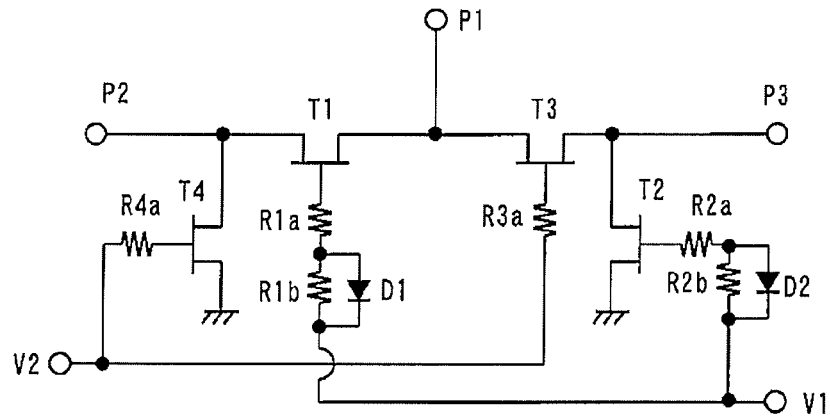
FIG. 1 is a circuit diagram showing a switch circuit according to the first embodiment of the present invention.

FIG. 1 is a circuit diagram showing a switch circuit according to the first embodiment of the present invention. Transistors T1 and T2, T3, and T4 are field-effect transistors used as switching elements. Control voltage applying terminals V1 and V2 are terminals for applying a control voltage for switching the switch. Resistors R1a, R1b, R2a, R2b, R3a, and R4a are isolation resistors having a resistance of several kΩ or more connected to the gates of respective transistors.

The transistor T1 is connected between an input-output terminal P1 and an input-output terminal P2. The transistor T2 is connected between an input-output terminal P3 and a grounding point. The transistor T3 is connected between an input-output terminal P1 and the input-output terminal P3. The transistor T4 is connected between the input-output terminal P2 and a grounding point. The control voltage applying terminal V1 is connected to the gates of transistors T1 and T2. The control voltage applying terminal V2 is connected to the gates of transistors T3 and T4.

Resistors R1a and R1b are connected in series between the gate of the transistor T1 and the control voltage applying terminal V1. Resistors R2a and R2b are connected in series between the gate of the transistor T2 and the control voltage applying terminal V1. A resistor R3a is connected between the gate of the transistor T3 and the control voltage applying terminal V2, and a resistor R4a is connected between the gate of the transistor T4 and the control voltage applying terminal V2. Diodes D1 and D2 are connected to the resistors R1b and R2b in parallel, respectively. The cathodes of the diodes D1 and D2 are connected to the control voltage applying terminal V1.

Figure 17:
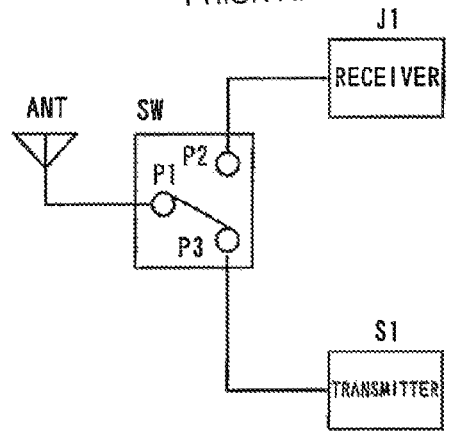
FIGS. 17, 18, and 19 are diagrams of systems using switch circuits.

Next, the operation of the switch circuit will be described. When the switch circuit is used in the system shown in FIG. 17, the input-output terminal P1 is connected to the antenna ANT, the input-output terminal P2 is connected to the receiver J1, and the input-output terminal P3 is connected to the transmitter S1. When transmitting, 0 V is applied to the control voltage applying terminal V2, and OFF voltage Vc, which is the pinch-off voltage Vp or lower, of the transistor is applied to the control voltage applying terminal V1. Transistors T3 and T4 are turned ON, and transistors T1 and T2 are turned OFF. Signals are passed from the input-output terminal P3 to the input-output terminal P1.

Figure 18:
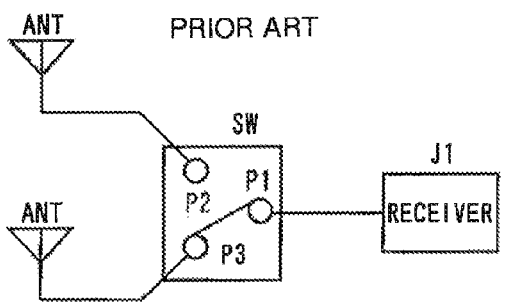

When the switch circuit is used in the system shown in FIG. 18, the input-output terminal P1 is connected to the receiver J1, and the input-output terminals P2 and P3 are connected to the antenna ANT. By turning the transistors T1, T2, T3, and T4 ON or OFF by the voltage applied to the control voltage applying terminals V1 and V2, the signals from the antenna ANT are switched.

Figure 19:
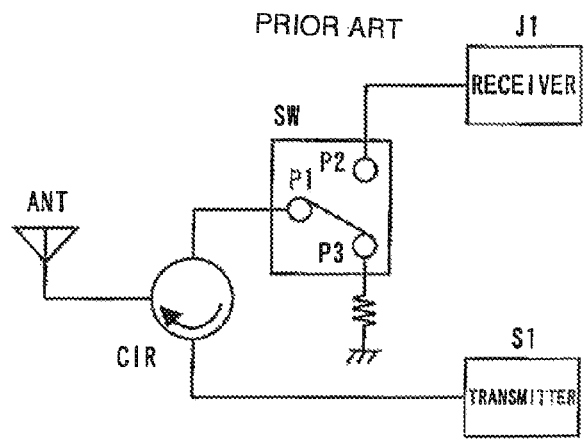

When the switch circuit is used in the system shown in FIG. 19, the input-output terminal P1 is connected to a circulator CIR, the input-output terminal P2 is connected to the receiver J1, and the input-output terminal P3 is connected to the transmitter 51. In transmission, signals are passed from the input-output terminal P1 to the input-output terminal P3, the receiver J1 is protected by applying 0 V to the control voltage applying terminal V2, and applying the OFF voltage Vc to the control voltage applying terminal V1.

Figure 2:
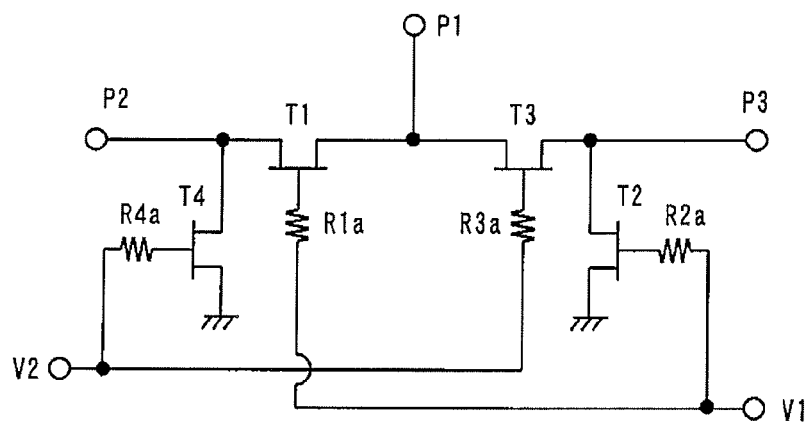
FIG. 2 is a circuit diagram showing a switch circuit according to the comparative example.

Next, the effect of the present embodiment will be described by comparing with a comparative example. FIG. 2 is a circuit diagram showing a switch circuit according to the comparative example. Resistors R1b and R2b and diodes D1 and D2 in the first embodiment are not present.

The power durability Pmax of the switch circuit according to the comparative example is shown by the following expression:

$$Pmax=2*(Vc-Vp)^2/Zo \quad (1)$$

Here, the characteristic impedance Zo is normally 50 Ω.

Here, when the power of signals inputted to the switch circuit is low, only little gate current Ig flows in the transistors T1 and T2 in the OFF state, and a voltage almost close on the OFF voltage Vc applied to the control voltage applying terminal V1 is applied to the gates of the transistors T1 and T2.

Figure 3:
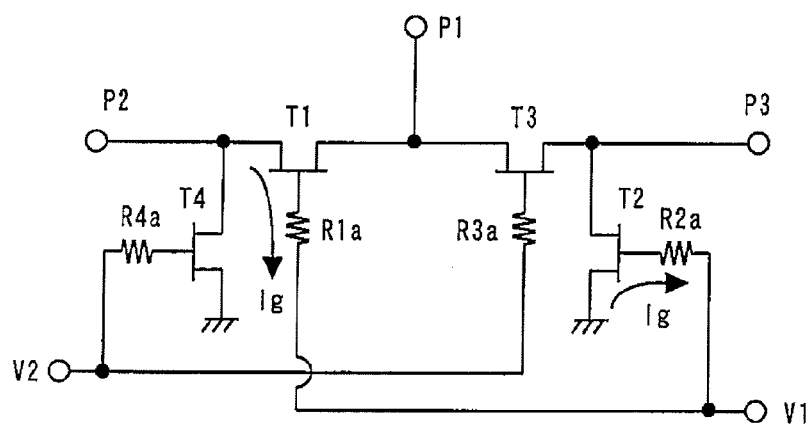
FIG. 3 is a circuit diagram showing the operations of the switch circuit in a comparative example when high power signals are inputted.

FIG. 3 is a circuit diagram showing the operations of the switch circuit in a comparative example when high power signals are inputted. When the power of signals inputted in the switch circuit is large, since the gate current Ig of the transistors T1 and T2 in the OFF state is strengthened and flows into the resistors R1a and R2a in the gate portion, the control voltage Vc' applied to the gate of the transistors T1 and T2 is varied. The control voltage Vc' is indicated by the following formula:

$$Vc'=Vc-R*Ig \quad (2)$$

Here, R denotes the resistance value of the resistors R1a and R2a. Due to the variation of the control voltage Vc', the power durability of the switch circuit is lowered.

Figure 4:
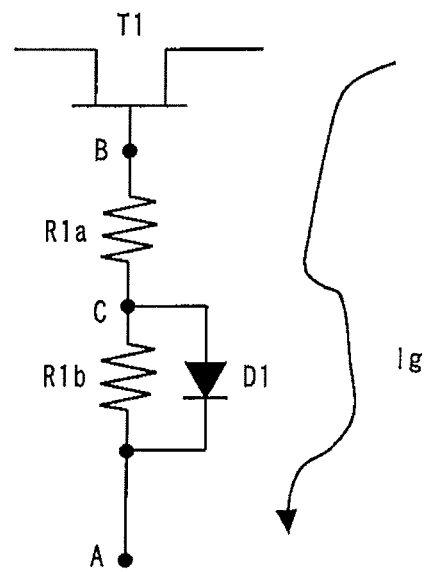
FIG. 4 is a circuit diagram showing the operations of a switch circuit according to the first embodiment of the present invention, when high power signals are inputted.

FIG. 4 is a circuit diagram showing the operations of a switch circuit according to the first embodiment of the present invention, when high power signals are inputted. The voltage at the point A is identical to the control voltage Vc. Due to the elevation of the gate current Ig, voltage lowering occurs between the both ends (between point A and point C) of the resistor R1b. Since the gate current Ig flows in the diode D1 when this voltage exceeds the forward voltage of the diode D1, no further voltage lowering occurs. Therefore, the control voltage of the transistor T1 (the voltage at point B) is indicated by the following formula:

$$Vc+(R1a+R1b)*Ig>Vc+R1a*Ig+\phi b \quad (3)$$

Here, φb denotes the forward voltage of the diode D1. When the resistance value of the resistor R1b is selected so as to satisfy the above formula (3), the variation of the control voltage of the transistor T1 can be lowered. Therefore, the power durability in the OFF side can be improved by a simple circuit configuration.

Figure 5:
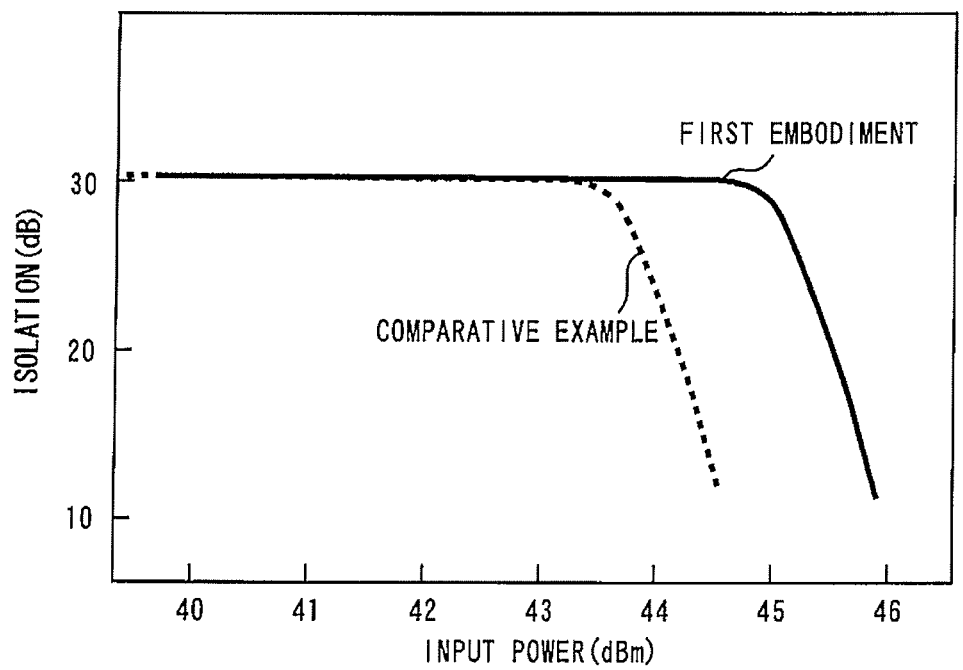
FIG. 5 is a graph showing the result of calculating the power durability of the switch circuits in the first embodiment and the comparative example.

FIG. 5 is a graph showing the result of calculating the power durability of the switch circuits in the first embodiment and the comparative example. As the transistor, a GaN transistor formed on a SiC substrate was used under the conditions of R1a=0.5 kΩ, R1b=1.5 kΩ, φb=0.8V, Vc=−30V, and Vp=−2V. The power durability of the switch circuits in the comparative example was 43 dBm, while the power durability of the switch circuits in the present embodiment was improved to 44.5 dBm.

Figure 6:
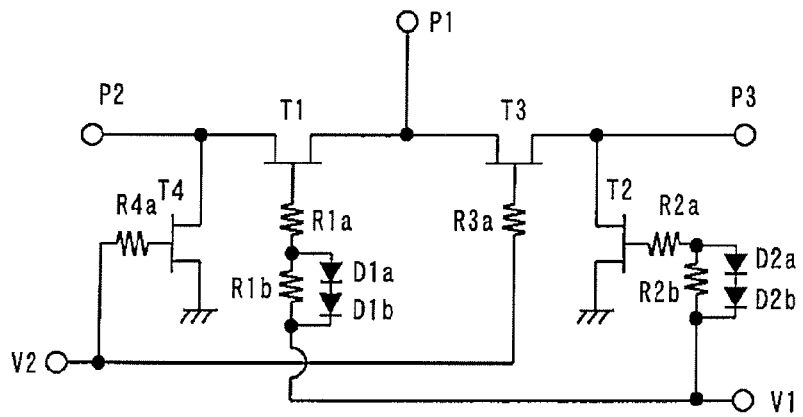
FIG. 6 is a circuit diagram showing a modified example of the switch circuit according to the first embodiment of the present invention.

FIG. 6 is a circuit diagram showing a modified example of the switch circuit according to the first embodiment of the present invention. In place of the diode D1, diodes D1a and D1b connected in series were used. In place of the diode D2, diodes D2a and D2b connected in series were used. By thus making the two-stage diode, the forward voltage of the diode is doubled, and the adjustment of the power durability value according to the system becomes feasible. Furthermore, the diode can be three stages or more.

Second Embodiment

Figure 7:
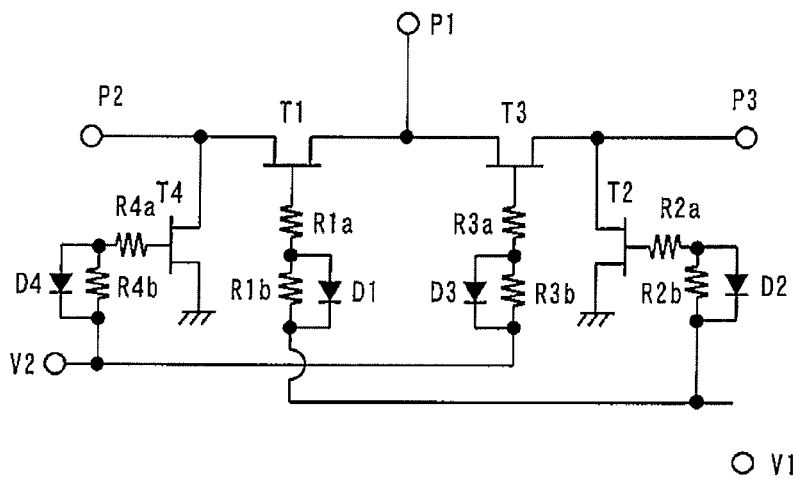
FIG. 7 is a circuit diagram showing a switch circuit according to the second embodiment of the present invention.

FIG. 7 is a circuit diagram showing a switch circuit according to the second embodiment of the present invention. In addition to the configuration in the first embodiment, resistors R3b and R4b are connected between the gate of the transistors T3 and T4, and the control voltage applying terminal V2, respectively. The diodes D3 and D4 are connected in parallel to the resistors R3b and R4b, respectively. The cathodes of the diodes D3 and D4 are connected to the control voltage applying terminal V2.

In the present embodiment, diodes are installed in parallel to a part of each gate resistor of the transistors in both paths of the switch. When these switch circuits are used in the system shown in FIG. 18, power durability to high power signals from the plural antennas in receiving are improved. As a result, the lowering of the signal switching accuracy of the switch circuits can be prevented.

Figure 8:
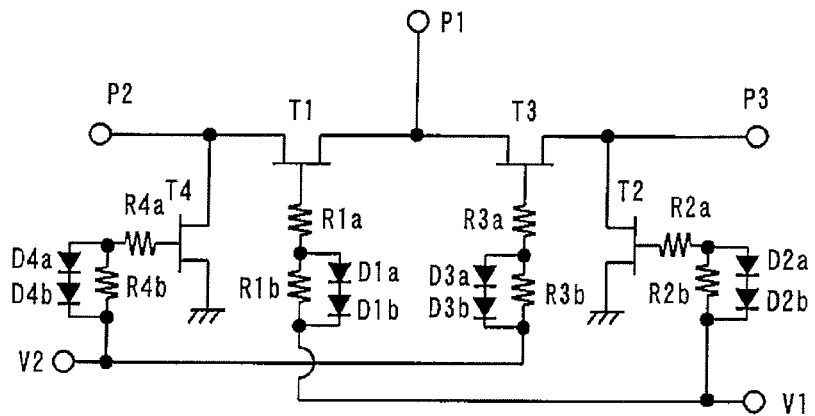
FIG. 8 is a circuit diagram showing a modified example of the switch circuit according to the second embodiment of the present invention.

FIG. 8 is a circuit diagram showing a modified example of the switch circuit according to the second embodiment of the present invention. In place of the diode D3, diodes D3a and D3b connected in series are used, and in place of the diode D4, diodes D4a and D4b connected in series are used. By thus making the two-stage diode, the forward voltage of the diode is doubled, and the adjustment of the power durability value according to the system becomes feasible. Furthermore, the diode can be three stages or more.

Third Embodiment

Figure 9:
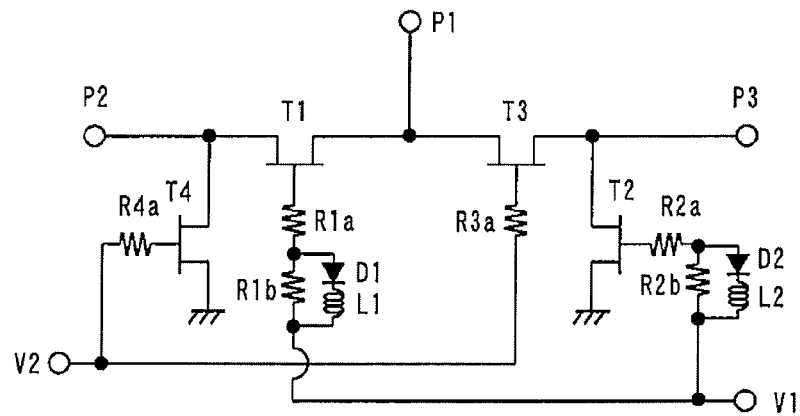
FIG. 9 is a circuit diagram of a switch circuit according to the third embodiment of the present invention.

FIG. 9 is a circuit diagram of a switch circuit according to the third embodiment of the present invention. In addition to the configuration of the first embodiment, the choke inductors L1 and L2 are connected to the resistors R1b and R2b in parallel, and connected to the diodes D1 and D2 in series, respectively. Here, since the gate current flows to the diodes D1 and D2, the resistors R1b and R2b connected in parallel are shorted. In order to prevent the lowering of impedance by choke inductors L1 and L2 at this time, the isolation function can be held.

Fourth Embodiment

Figure 10:
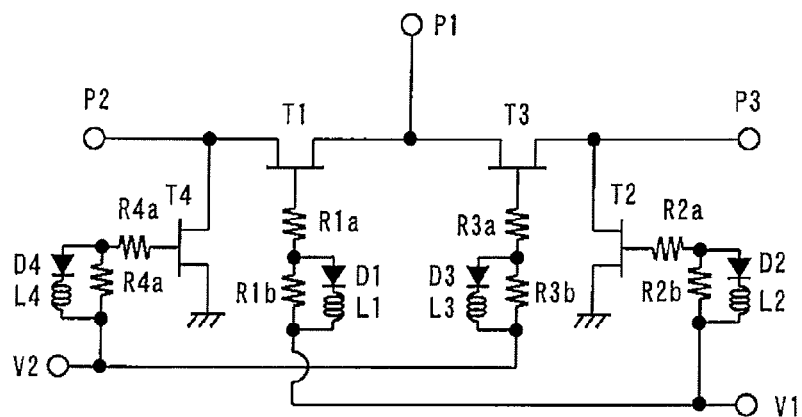
FIG. 10 is a circuit diagram showing a switch circuit according to the fourth embodiment of the present invention.

FIG. 10 is a circuit diagram showing a switch circuit according to the fourth embodiment of the present invention. In addition to the configuration of the second embodiment, choke inductors L1, L2, L3, and L4 are connected to resistors R1, R2, R3, and R4 in parallel, respectively; and connected to diodes D1, D2, D3, and D4 in series, respectively. Thereby, the effect of the second and third embodiments can be obtained.

Fifth Embodiment

Figure 11:
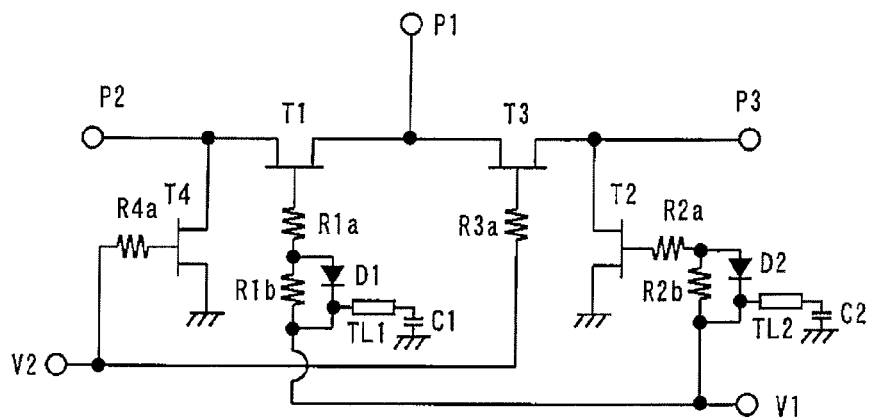
FIG. 11 is a circuit diagram showing a switch circuit according to the fifth embodiment of the present invention.

FIG. 11 is a circuit diagram showing a switch circuit according to the fifth embodiment of the present invention. Transmitting lines TL1 and TL2 having the length of the quarter wavelength of the signals passing through the switch circuit are connected between diodes D1 and D2, and the grounding point in series, respectively. Capacitors C1 and C2 are connected to transmitting lines TL 1 and TL2 in series, respectively. In other words, in the present embodiment, the inductor in the third embodiment is replaced by the transmitting lines and capacitors of the quarter wavelength of the transmitting signals. Thereby, the circuit can be down-sized.

Sixth Embodiment

Figure 12:
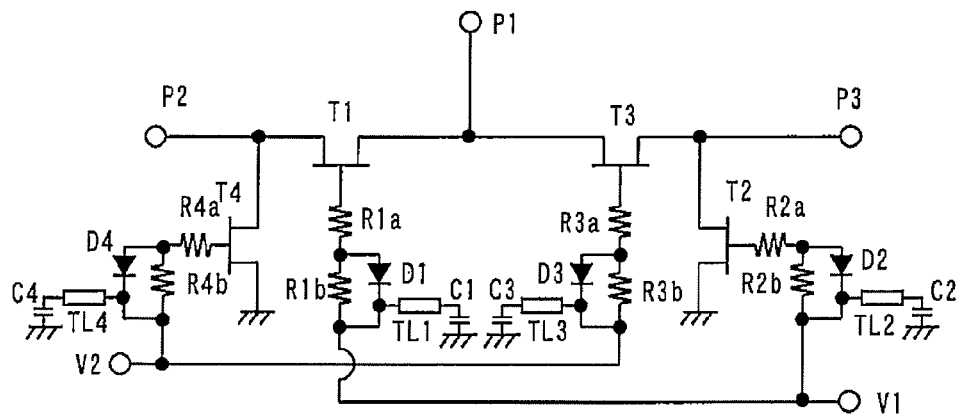
FIG. 12 is a circuit diagram showing a switch circuit according to the sixth embodiment of the present invention.

FIG. 12 is a circuit diagram showing a switch circuit according to the sixth embodiment of the present invention. Transmitting lines TL1, TL2, TL3, and TL4 having the length of the quarter wave length of the signals passing through the switch circuit are connected to diodes D1, D2, D3, and D4, and the grounding point in series, respectively. Capacitors C1, C2, C3, and C4 are connected to transmitting lines TL1, TL2, TL3, and TL4 in series, respectively. In other words, in the present embodiment, the inductors in the fourth embodiment is replaced by the transmitting line and the capacitor of the transmitting signals having the length of the quarter wave length of the transmitting signals. Thereby, the circuit can be down-sized.

Seventh Embodiment

Figure 13:
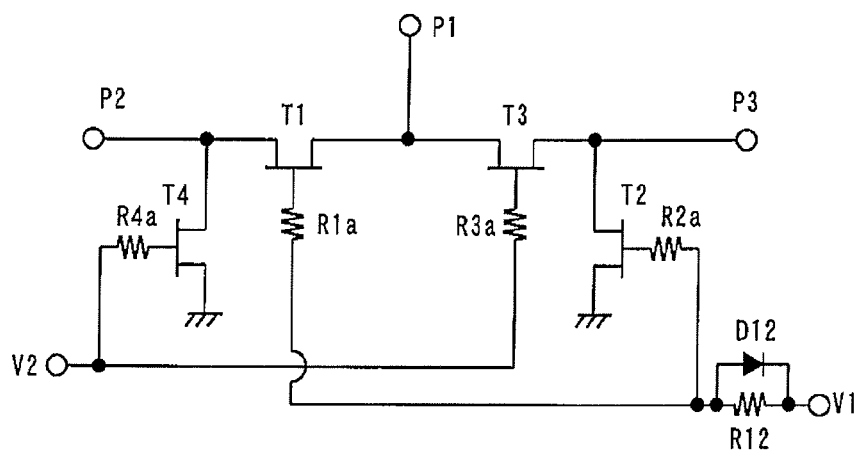
FIG. 13 is a circuit diagram showing a switch circuit according to the seventh embodiment of the present invention.

FIG. 13 is a circuit diagram showing a switch circuit according to the seventh embodiment of the present invention. In place of the resistors R1b and R2b and the diodes D1 and D2 in the first embodiment, a resistor R12 and a diode D12 are provided. The resistor R12 is connected between the joining point of the gates of the transistors T1 and T2, and the control voltage applying terminal V1. The diode D12 is connected to the resistor R12 in parallel, and the cathode of the diode D12 is connected to the control voltage applying terminal V1.

Thereby, since the gate current in the time of high input power flowing through a part of the gate resistor is doubled (the number of transistors commonly connected), the variation of the control voltage to the high input power can be further inhibited.

Eighth Embodiment

Figure 14:
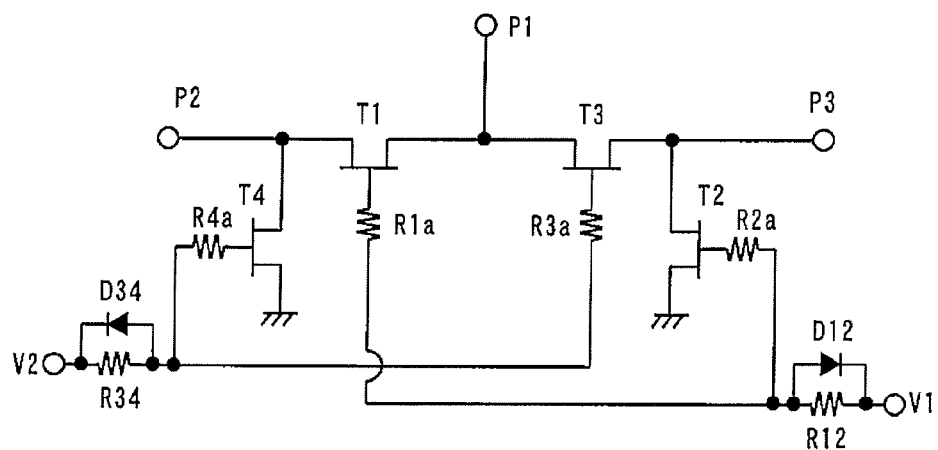
FIG. 14 is a circuit diagram showing a switch circuit according to the eighth embodiment of the present invention.

FIG. 14 is a circuit diagram showing a switch circuit according to the eighth embodiment of the present invention. In addition to the configuration in the seventh embodiment, a resistor R34 and a diode D34 are provided. The resistor R34 is connected between the joining point of the gates of the transistors T3 and T4, and the control voltage applying terminal V2. The diode D34 is connected to the resistor R34 in parallel, and the cathode of the diode D34 is connected to the control voltage applying terminal V2.

In the present embodiment, a diode is provided in a part of the gate resistor of the transistor in both paths of the switch, in parallel. When this switch circuit is used in the system shown in FIG. 18, power durability is improved against the high power signals from a plurality of antennas during reception. As a result, the lowering of the signal switching accuracy by the switch circuit can be prevented. In addition, the effect of the seventh embodiment can also be obtained.

Ninth Embodiment

Figure 15:
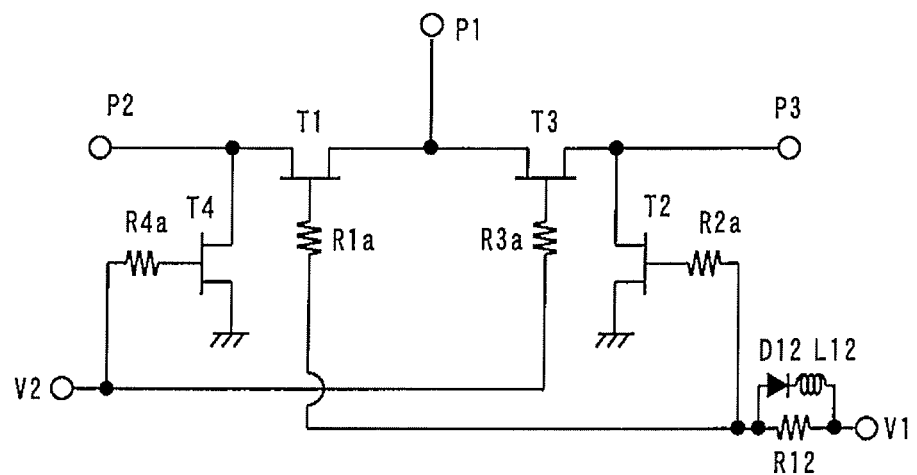
FIG. 15 is a circuit diagram showing a switch circuit according to the ninth embodiment of the present invention.

FIG. 15 is a circuit diagram showing a switch circuit according to the ninth embodiment of the present invention. In addition to the configuration of the seventh embodiment, a choke inductor L12 is connected to the resistor R12 in parallel, and connected to the diode D12 in series. Since the lowering of impedance when the resistor R12 is short-circuited can be protected by the choke inductor L12, the isolation function can be maintained.

Tenth Embodiment

Figure 16:
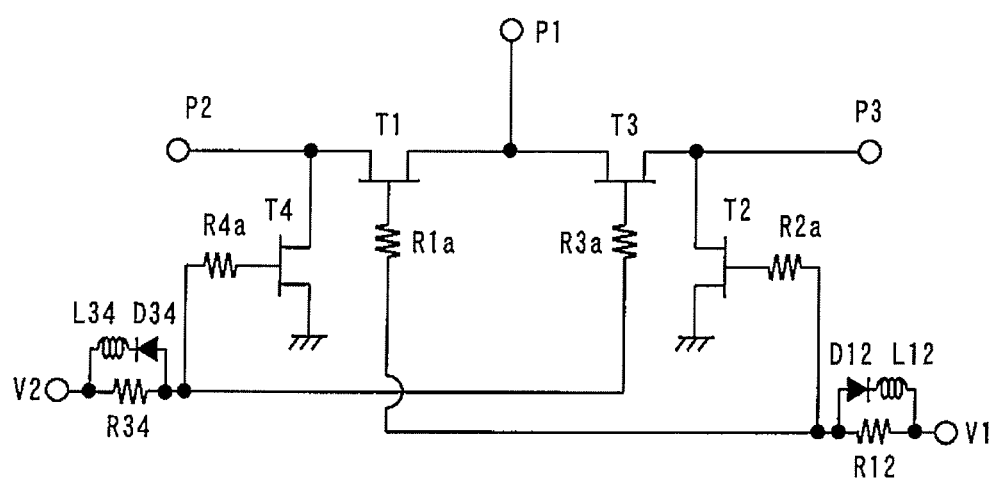
FIG. 16 is a circuit diagram showing a switch circuit according to the tenth embodiment of the present invention.

FIG. 16 is a circuit diagram showing a switch circuit according to the tenth embodiment of the present invention. In addition to the configuration of the eighth embodiment, the choke inductors L12 and L34 are connected to the resistors R12 and R34 in parallel, and to the diodes D12 and D34 in series, respectively. Since the lowering of impedance when the resistors R12 and R34 are short-circuited is prevented by the choke inductors L12 and L34, isolation functions can be maintained.

In above-described first to tenth embodiments, the transistors can be formed on the semi-insulating substrates, such as a GaAs substrate, a Si substrate, a GaN on SiC substrate, or a GaN on Si substrate.

Furthermore, the switch circuits in the first to tenth embodiments can be monolithic microwave integrated circuits (MMIC) wherein not only transistors, but also matching circuits, gate resistors, diodes, choke inductors, transmission lines, or MIM capacitors formed on a semi-insulating substrate. Thereby, further down-sizing and integration become feasible. In addition, the switch circuits according to the first to tenth embodiments can be applied to transmitting and receiving modules.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-287750, filed on Dec. 28, 2011, including specification, claims, drawings, and summary, on which the Convention priority of the present application is based, is incorporated herein by reference in its entirety.

What is claimed is:

1. A switch circuit comprising:
first, second, and third input-output terminals;
a first switching element connected between the first input-output terminal and the second input-output terminal;
a second switching element connected between the third input-output terminal and a grounding point;
a third switching element connected between the first input-output terminal and the third input-output terminal;
a fourth switching element connected between the second input-output terminal and the grounding point;
a first control voltage applying terminal connected to control terminals of the first and second switching elements;
a second control voltage applying terminal connected to control terminals of the third and fourth switching elements;
a first resistor connected between the control terminal of the first switching element and the first control voltage applying terminal;
a second resistor connected between the control terminal of the second switching element and the first control voltage applying terminal;
a first diode and a first inductor connected in series, wherein the series-connected first diode and first inductor are connected in parallel with the first resistor, and
a second diode and a second inductor connected in series, wherein
the series-connected second diode and second inductor are connected in parallel with the second resistor, and
the first and second diodes have respective cathodes connected to the first control voltage applying terminal.

2. The switch circuit according to claim 1, further comprising:
a third resistor connected between the control terminal of the third switching element and the second control voltage applying terminal;
a fourth resistor connected between the control terminal of the fourth switching element and the second control applying terminal;
a third diode and a third inductor connected in series, wherein the series-connected third diode and third inductor are connected in parallel with the third resistor, and
a fourth diode and a fourth inductor are connected in series, wherein
the series-connected fourth diode and fourth inductor are connected in parallel with the fourth resistor, and
the third and fourth diodes have respective cathodes connected to the second control voltage applying terminal.

* * * * *